(12) United States Patent
Butler et al.

(10) Patent No.: US 8,781,775 B2
(45) Date of Patent: Jul. 15, 2014

(54) LITHOGRAPHIC APPARATUS AND METHOD FOR CORRECTING A POSITION OF A STAGE OF A LITHOGRAPHIC APPARATUS

(75) Inventors: Hans Butler, Best (NL); Emiel Jozef Melanie Eussen, Eindhoven (NL); Willem Herman Gertruda Anna Koenen, Roermond (NL); Engelbertus Antonius Fransiscus Van Der Pasch, Oirschot (NL); Harmen Klaas Van Der Schoot, Vught (NL); Marc Wilhelmus Maria Van Der Wijst, Veldhoven (NL); Marcus Martinus Petrus Adrianus Vermeulen, Leende (NL); Cornelius Adrianus Lambertus De Hoon, Best (NL)

(73) Assignee: ASML Netherlands B.V., Veldhoven (NL)

( * ) Notice: Subject to any disclaimer, the term of this patent is extended or adjusted under 35 U.S.C. 154(b) by 722 days.

(21) Appl. No.: 13/018,226

(22) Filed: Jan. 31, 2011

(65) Prior Publication Data

US 2011/0208459 A1  Aug. 25, 2011

Related U.S. Application Data

(60) Provisional application No. 61/307,636, filed on Feb. 24, 2010, provisional application No. 61/315,287, filed on Mar. 18, 2010.

(51) Int. Cl.
*G01C 17/38* (2006.01)

(52) U.S. Cl.
USPC ............. 702/94; 702/84; 702/86; 702/104

(58) Field of Classification Search
USPC ........ 702/86, 84, 104; 430/30, 296, 311, 397, 430/942; 356/364–370
See application file for complete search history.

(56) References Cited

U.S. PATENT DOCUMENTS

| | | | | |
|---|---|---|---|---|
| 6,654,095 B1 * | 11/2003 | Nishi | ............... | 355/30 |
| 6,654,100 B2 * | 11/2003 | Yoda | ............... | 355/53 |
| 7,420,299 B2 * | 9/2008 | Butler et al. | ............... | 310/12.06 |

(Continued)

FOREIGN PATENT DOCUMENTS

| | | |
|---|---|---|
| JP | H11-260681 | 9/1999 |
| JP | 2009-252986 | 10/2009 |

(Continued)

OTHER PUBLICATIONS

Japanese Office Action mailed Jul. 27, 2012 in corresponding Japanese Patent Application No. 2011-031905.

*Primary Examiner* — Elias Desta
(74) *Attorney, Agent, or Firm* — Pillsbury Winthrop Shaw Pittman LLP

(57) ABSTRACT

A lithographic apparatus includes a stage to hold an object, the stage being moveable relative to a reference structure in a motion range; a magnet structure to provide a spatially varying magnetic field in at least a part of the motion range, the magnet structure being moveable relative to the reference structure and the stage; a first position measurement system to provide a first measurement signal corresponding to a position of the stage and/or the object in a measurement direction relative to the reference structure; a second position measurement system to provide a second measurement signal corresponding to a position of the stage relative to the magnet structure; and a data processor to correct the first measurement signal with a value dependent on the second measurement signal to provide a corrected first measurement signal representative of the position of the stage and/or the object relative to the reference structure in the measurement direction.

16 Claims, 4 Drawing Sheets

(56) References Cited

U.S. PATENT DOCUMENTS 8,446,567 B2 5/2013 Butler et al.
2009/0262326 A1 10/2009 Butler et al.

FOREIGN PATENT DOCUMENTS

TW 200949465 12/2009
WO 00/46911 8/2000

* cited by examiner

LITHOGRAPHIC APPARATUS AND METHOD FOR CORRECTING A POSITION OF A STAGE OF A LITHOGRAPHIC APPARATUS

CROSS REFERENCE TO RELATED APPLICATIONS

This application claims priority and benefit under 35 U.S.C. §119(e) to U.S. Provisional Patent Application No. 61/307,636, entitled "Stage System For A Lithographic Apparatus", filed on Feb. 24, 2010 and U.S. Provisional Patent Application No. 61/315,287, entitled "Lithographic Apparatus and Method For Correcting A Position Of An Stage Of A Lithographic Apparatus", filed on Mar. 18, 2010. The contents of these applications are incorporated herein in their entirety by reference.

FIELD

The present invention relates to a lithographic apparatus and a method for correcting a position of a stage relative to a reference structure of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Generally, a lithographic apparatus includes a stage configured to hold an object, e.g. a substrate or patterning device, the stage being moveable relative to a reference structure. Positioning of the stage is done using a position measurement system to measure a position of the stage relative to the reference structure in a measurement direction, an actuator system to move the stage relative to the reference structure, and a control system or controller providing drive signals to the actuator system based on an output of the position measurement system.

It is desirable to position the stage in a direction in plane of the object, i.e. perpendicular to the radiation beam imparted to the object, for overlay. Overlay is the accuracy within which layers are printed in relation to layers that have previously been formed, and is an important factor in the yield, i.e. the percentage of correctly manufactured devices.

It is desirable to position the stage in a direction out of plane of the object, i.e. parallel to the radiation beam imparted to the object, for focus of the pattern, for instance onto the substrate, and determines the amount of blur of the pattern on the substrate.

It has been found that the positioning accuracy in one or more directions may not be satisfactory, especially not to meet future demands in lithography.

SUMMARY

It is desirable to provide an improved lithographic apparatus, in particular a lithographic apparatus having an improved positioning accuracy of its stage.

According to an embodiment of the invention, there is provided a lithographic apparatus including a reference structure; a stage to hold an object, the stage being moveable relative to the reference structure in a motion range; an magnet structure to provide a spatially varying magnetic field in at least a part of the motion range, the magnet structure being moveable relative to the reference structure and the stage; a first position measurement system to provide a first measurement signal corresponding to a position of the stage and/or the object in a measurement direction relative to the reference structure; a second position measurement system to provide a second measurement signal corresponding to a position of the stage relative to the magnet structure; and a data processing device configured to correct the first measurement signal with a value which is dependent on the second measurement signal to provide a corrected first measurement signal representative for the position of the stage and/or the object relative to the reference structure in the measurement direction.

According to another embodiment of the invention, there is provided a method for correcting a position measurement of a stage and/or an object held by the stage relative to a reference structure in a measurement direction, wherein the stage is moveable in a spatially varying magnetic field which in turn is moveable relative to the stage and the reference structure, the method including providing a first measurement signal corresponding to a position of the stage and/or the object relative to the reference structure in the measurement direction; providing a second measurement signal corresponding to a position of the stage relative to the magnetic field; correcting the first measurement signal with a value which is dependent on the second measurement signal to provide a corrected first measurement signal representative for the position of the stage and/or the object relative to the reference structure in the measurement direction.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
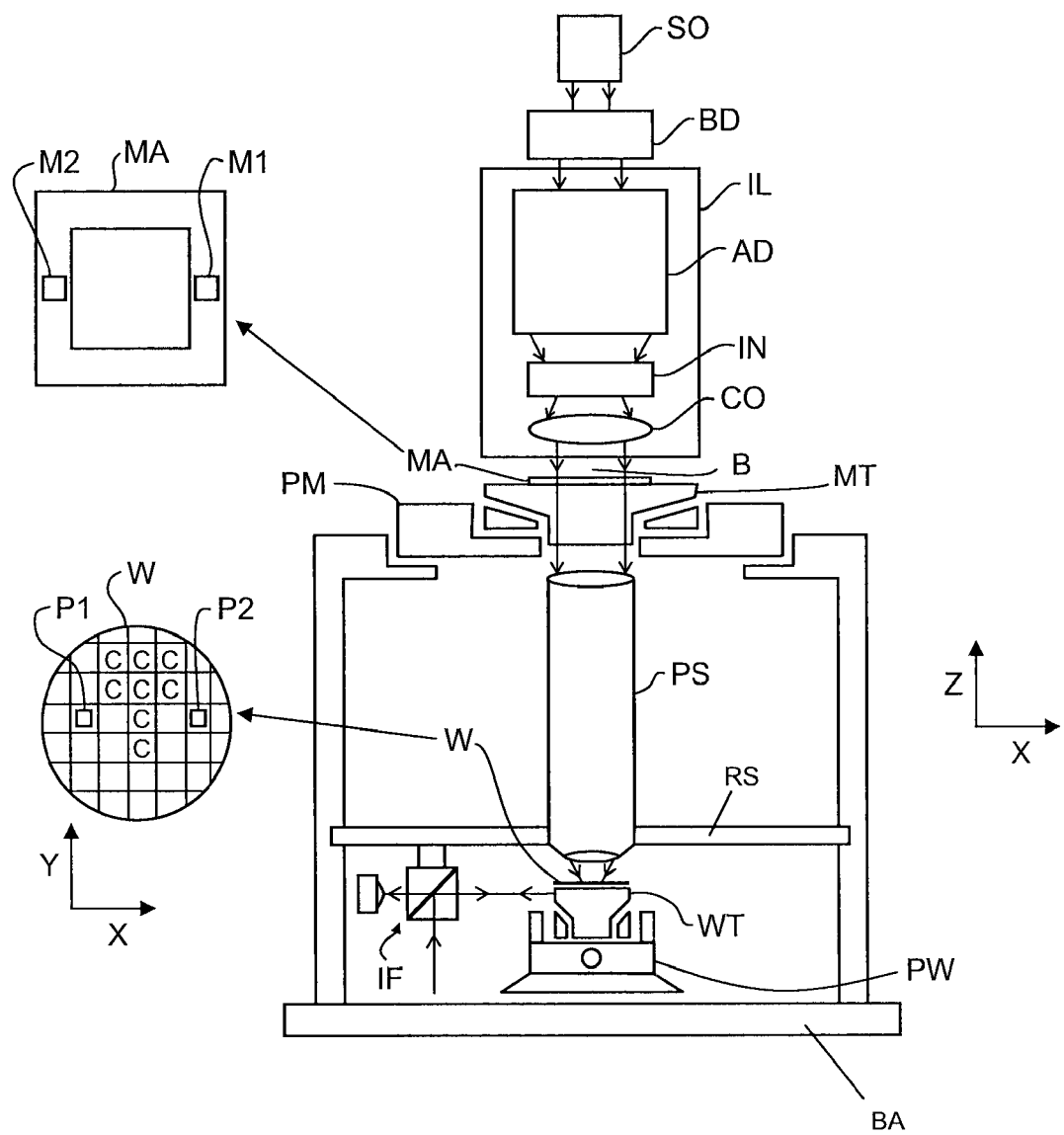
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support mask stage (e.g. a mask table) MT constructed to support a patterning device (e.g. a mask) MA and connected to a first positioning device PM configured to accurately position the patterning device in accordance with certain parameters.

The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support or mask holds the patterning device in a manner that depends on the orientation of the patterning device, the design of the lithographic apparatus, and other conditions, such as for example whether or not the patterning device is held in a vacuum environment. The patterning device support or mask stage can use mechanical, vacuum, electrostatic or other clamping techniques to hold the patterning device. The patterning device support or mask stage may be a frame or a table, for example, which may be fixed or movable as required. The patterning device support or mask stage may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support or mask stage (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and a first position measurement system in the form of a position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. In the case of a stepper (as opposed to a scanner) the patterning device support (e.g. mask table) MT may be connected to a short-stroke actuator only, or may be fixed. Similarly, movement of the substrate table WT or "substrate support" may be realized using a long stroke module and a short stroke module, which form part of the second positioner PW. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable minor array of a type as referred to above.

Combinations and/or Variations on the Above Described Modes of Use or Entirely Different Modes of Use May Also be Employed.

Figure 2:
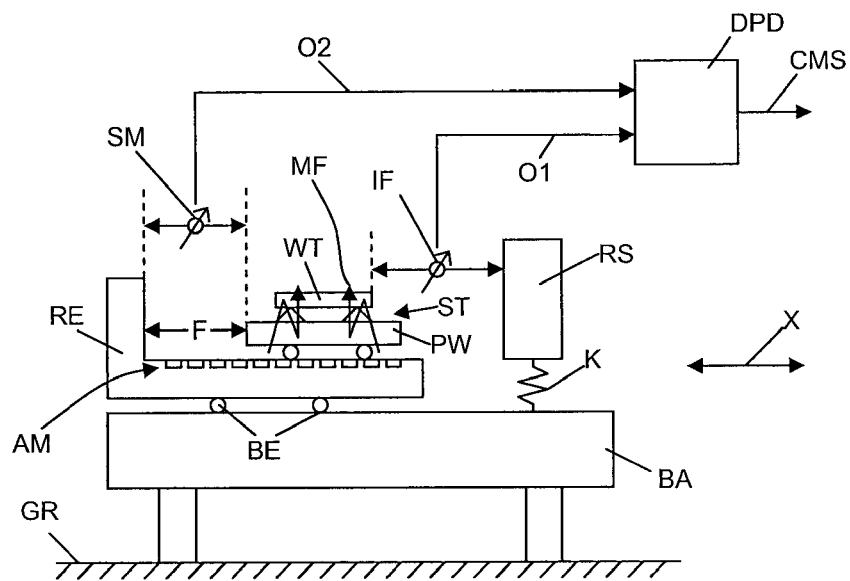
FIG. 2 depicts in schematic view a part of the lithographic apparatus of FIG. 1 in accordance with an embodiment of the invention.

FIG. 2 depicts in schematic view a part of the lithographic apparatus of FIG. 1. Shown are the second positioning device PW and the substrate table WT, which together form a stage ST to hold the substrate. Further shown are a base BA which supports a reference structure RS and an element or magnet structure RE. The reference structure RS is low-frequency supported with respect to the base as is indicated by spring K. This limits the amount of disturbances entering the reference structure via the base, for instance vibrations of a ground GR supporting the lithographic apparatus. Note that the reference structure RS may also be supported on the ground GR instead of by the base BA.

The stage ST is supported by the element or magnet structure RE. Alternatively, the stage could also have been supported by the base BA directly. The stage ST is positioned by a long stroke module of the second positioning device PW, which includes coils (not shown) arranged on the second positioning device PW and an array of permanent magnets AM arranged on the element or magnet structure RE, the coils and permanent magnets cooperating to provide a force F to the stage to move and/or position the stage. It will be appreciated that the magnet structure may include other types of magnets, for example, non-permanent magnets. Due to this configuration, the element or magnet structure RE provides a magnetic field MF to the stage. In this embodiment, as the array of permanent magnets is part of an actuation system to position the stage, the magnetic field is provided in an entire motion range of the stage. However, an embodiment of the invention also relates to magnet structures providing a magnetic field to only a portion of the motion range of the stage. Further, an opposite configuration where the permanent magnets are arranged on the second positioning device PW and the coils are arranged on the element or magnet structure RE also falls within an embodiment of the invention.

The magnetic field MF provided by the element or magnet structure RE will be, due to its nature, a spatially varying magnetic field, so that the magnetic field that the stage "sees", i.e. experiences, is dependent on the position of the element or magnet structure relative to the stage. The magnetic field MF may not only cooperate with the coils in the second positioning device, but may also act on other components of the stage, e.g. components including ferromagnetic materials, resulting in deformations of the stage. As the magnetic field is spatially varying, the deformations will also vary as a function of the position of the element or magnet structure relative to the stage. It has been found that these deformations resulting from the magnetic field provided by the element or magnet structure have an impact on the measurement accuracy of the position sensor IF, which measures the position of the stage relative to the reference structure in measurement direction X. This will be elucidated with reference to FIG. 3.

Figure 3:
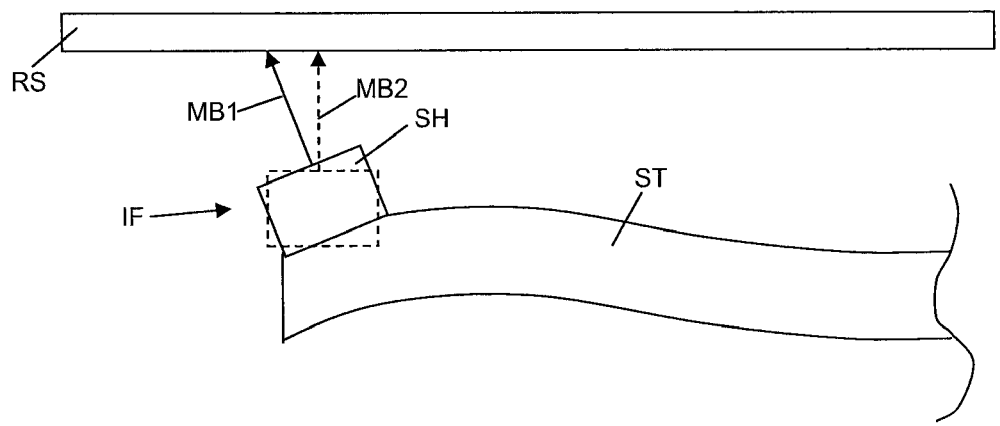
FIG. 3 depicts schematically the impact of deformation of a stage on a first position measurement system of the lithographic apparatus of FIG. 1.

In FIG. 3, a portion of the stage ST is shown. Also shown is position sensor IF measuring the position of the stage ST relative to the reference structure RS. Due to the interaction between the stage ST and the magnetic field MF (see FIG. 2), the stage ST is deformed as shown in FIG. 3.

The position sensor IF includes a sensor head SH that emits a light or radiation beam to the reference structure which returns from the reference structure and is detected by a suitable detector. The sensor head SH is in this embodiment arranged on the stage ST and emits a light or radiation beam MB1 to the reference structure RS when the stage ST is deformed. In dashed lines, the sensor SH is shown in an undeformed state of the stage ST. In that case, the sensor head emits a light or radiation beam MB2. By comparing the two light or radiation beams MB1 and MB2, it will be appreciated by the person skilled in the art that the deformation of the stage ST due to the magnetic field is influencing the position measurement of the position sensor IF. As the deformation of the stage ST is dependent on the magnetic field, which is spatially varying, and thus the deformation of the stage ST is dependent on the position of the stage ST relative to the magnetic field, i.e. the element or magnet structure RE, the inconsistencies in the position measurement, i.e. in the measurement signal of the position sensor IF, is also dependent on the position of the stage ST relative to the magnetic field. Becoming aware of this relationship between inconsistencies in the position measurement and the position of the magnetic field relative to the stage ST has led to an embodiment of the invention. Until this moment of awareness, the cause of the "varying" inconsistencies was unknown.

In this embodiment, the position sensor IF measures a position of the stage ST relative to the reference structure RS. However, it is also envisaged that the position sensor IF measures a position of an object, e.g. a substrate, held by the stage ST. For instance, the position sensor measures the focus of the substrate with respect to the patterned radiation beam or the position sensor measures the alignment of the substrate with respect to the reticle, i.e. the patterning device for overlay. The reference structure then does not necessarily have to be a frame part as depicted in FIG. 1. In fact, the reference structure can be any kind of structure allowing a position sensor to accurately determine a position of the stage and/or the object held by the stage relative to the structure or indirectly relative to another object, e.g. a patterning device.

Referring to FIG. 2 again, the actuation system or actuator in the form of the long stroke module has been provided between the element or magnet structure RE and the stage ST. A benefit is that it minimizes forces applied to the base BA. In this embodiment, element or magnet structure RE is supported by the base BA via bearings BE minimizing the friction between element or magnet structure RE and base BA. The force F by the long stroke module of the stage is applied between the second positioning device PW and the element or magnet structure RE. As a result, the stage will move relative to the base (and the reference structure), and the element or magnet structure RE will move in the opposite direction. As the element or magnet structure RE is supported by the base BA via the bearings BE, the force F will not entirely, and in an embodiment not at all, be transmitted to the base BA, so that disturbances originating from the force F are absorbed with respect to the base and thus can not excite resonances in the reference structure via the base or at least the amplitude of the resonances can be reduced. As a consequence of this configuration, the position of the element or magnet structure and thus the magnetic field relative to the stage is not only dependent on the position of the stage relative to the reference structure, but also on other parameters such as friction between the element or magnet structure RE and the base BA and previous movements/accelerations of the stage. This effect is even worse, when another stage is provided having a further actuation system provided between the element or magnet structure RE and the other stage, e.g. as in a dual stage concept. The position of the element or magnet structure RE relative to the stage is then also dependent on the position of the other stage relative to the reference structure.

The lithographic apparatus includes a second position measurement system SM measuring the position of the stage relative to the element or magnet structure RE, thereby providing a second measurement signal O2 corresponding to the position of the stage relative to the element or magnet structure RE. This second measurement signal O2 is provided to a data processing device or data processor DPD along with a first measurement signal O1 of the position sensor IF, the first measurement signal in turn corresponding to the position of the stage relative to the reference structure.

Figure 4:
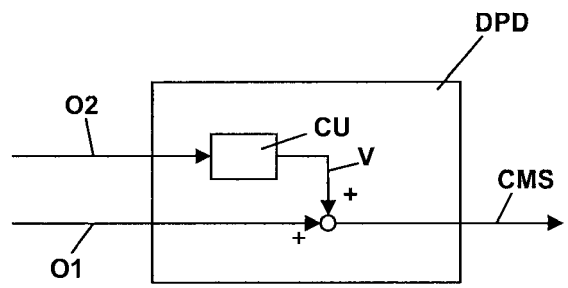
FIG. 4 depicts in block schematic view a data processing device of the lithographic apparatus of FIG. 1 in accordance with an embodiment of the invention.

FIG. 4 shows in block schematic view the schematic working principle of the data processing device or data processor DPD of FIG. 2. Input to the data processing device or data processor DPD are the first and second measurement signals O1 and O2 of respectively the position sensor IF and the second position measurement system SM. The data processing device or data processor DPD includes a correction unit or corrector CU containing the information about the inconsistencies as function of the relative position between the stage and the element or magnet structure enabling the correction unit or corrector to convert the relative position into a value V that is able to at least partially compensate, i.e. correct, the first measurement signal O1 of the first position measurement system, i.e. the position sensor IF, for the inconsistencies by adding this value to the first measurement signal O1. The data processing device or data processor DPD outputs a calibrated, i.e. corrected, measurement signal O1+V representative for the position of the stage relative to the reference structure in measurement direction X.

The information contained in the correction unit or corrector about the inconsistencies as a function of the relative position may be available as a look-up table or as a continuous or discrete mathematical function, wherein interpolation may be used to obtain information.

The position sensor IF may be an optical sensor such as an interferometer or an encoder-type sensor. In case of the later, the sensor may include a grating and a sensor head cooperating with the grating, wherein the grating is provided on one of the reference structure and the stage, and wherein the sensor head is provided on the other one of the reference structure and the stage. In an embodiment, the grating is provided on the reference structure and the sensor head is provided on the stage.

In FIG. 2, the second position measurement system SM may include two sensors and a processing unit or processor, one of the sensors being arranged such that its output signal is representative of the position of the stage relative to the base, which then acts as a measurement reference, and the other one of the sensors being arranged such that its output signal is representative of the position of the element or magnet structure relative to the base, and wherein the processing unit or processor is configured to combine the outputs of both sensors to provide a second measurement signal representative of the position of the stage relative to the element or magnet structure. In this case, the base acts as a measurement reference, but it is envisaged that other components of the lithographic apparatus can act as a measurement references as well, e.g. the reference structure.

The correction value V may be obtained in several ways. In one embodiment, the stage ST is kept stationary relative to the reference structure, so that in an ideal situation, the position sensor IF should constantly measure the same position. By changing the position of the element or magnet structure relative to the stage, the influence of the magnetic field on the stage is changing as well, thereby changing the deformation of the stage. As shown in relation to FIG. 3, deformations of the stage may introduce measurement errors. By measuring the first measurement signal for the different positions of the element or magnet structure relative to the stage, the measurement errors as a function of the relative position can be obtained. From the measurement errors, the correction value V can be derived.

It is possible that the magnetic field shows a periodic behavior, for instance in case of a regular array of permanent magnets. By determining the measurement errors in one period of the magnetic field, the measurement errors and thus the correction value V can be extrapolated to the entire magnetic field using this periodicity.

In an embodiment, the measurement errors/inconsistencies are determined in different overlapping ranges, whereafter the measurement results of the overlapping ranges are combined to obtain the measurement result for the entire motion range or period of the magnetic field.

In another embodiment, the correction value V is obtained by calibrating the first position measurement system for two different relative positions between the stage and the element or magnet structure. For instance, calibration of the first position measurement system can be done by moving the stage at a constant velocity using a poorly conditioned control system from position accuracy point of view, and registering the disturbances in the measurement result of the first position measurement system. The disturbances in the measurement result are related to the first position measurement system itself and are relatively constant and to the deformation of the stage. By repeating the calibration with a shifted position of the element or magnet structure relative to the stage, the two measurement results can be combined to obtain the disturbances resulting from the shifted position and a correction value can be extracted for the entire position range. In an embodiment, more shifted positions can be used to more accurately determine the correction value as a function of the relative position. In an example, the magnetic field and thus the element or magnet structure is kept stationary in a first position relative to the reference structure, and the stage is subsequently positioned at different positions, whereafter the element or magnet structure is kept stationary relative to the reference structure in a second position different from the first position and the measurements are repeated for the different positions. By comparing the measurement results for the first and second position, the correction value can be obtained.

Figure 5:
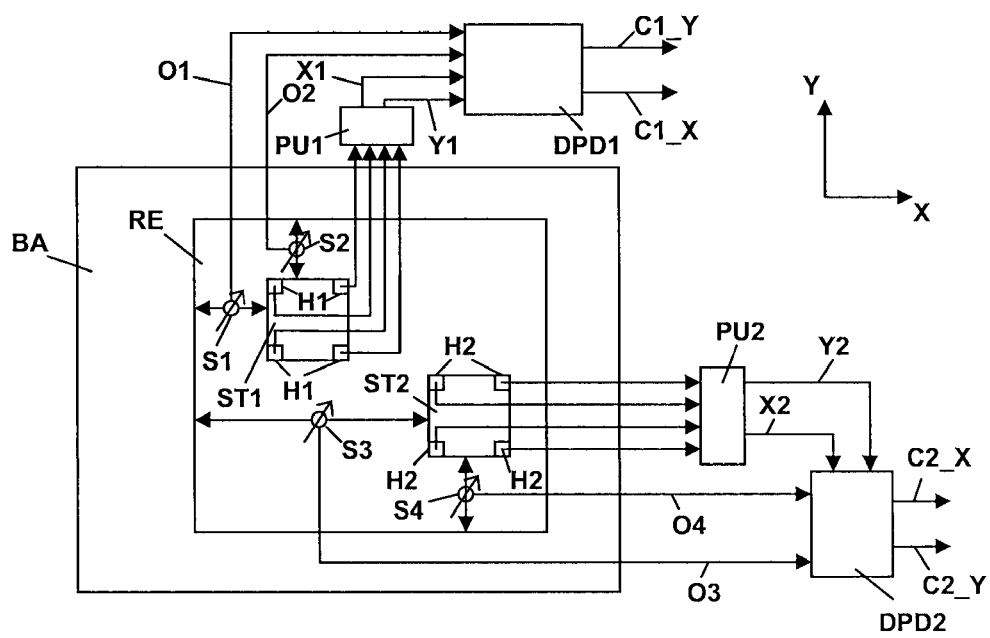
FIG. 5 depicts schematically a part of lithographic apparatus according to another embodiment of the invention.

FIG. 5 depicts schematically a part of a lithographic apparatus according to another embodiment of the invention in top view. Shown are a base BA supporting an element or magnet structure RE, which in turn supports two stages ST1, ST2 that each are able to hold an object (not shown), e.g. a substrate or patterning device.

The element or magnet structure RE is moveable with respect to the base BA and the stages. A mass of the element or magnet structure RE is larger than a mass of the individual stages. In fact, the mass of the element or magnet structure RE is much larger than the combined mass of stages and objects.

An actuation system (not shown) or actuator is arranged between each stage and the element or magnet structure RE to move the corresponding stage, and thereby position the stages relative to a reference structure (not shown). The actuation systems or actuators are able to position the objects in both an Y and an X direction. The element or magnet structure RE is, in an embodiment, free to move relative to the base, so that actuation forces applied between the element or magnet structure RE and a stage will move both the element or magnet structure RE and the stage with minimal transmitted forces to the base BA. As moving the stages also results in moving the element or magnet structure RE, the position of the element or magnet structure RE depends on movement of both the stages.

The element or magnet structure RE in this embodiment provides a spatially varying magnetic field in motion ranges of the stages, e.g. as it includes components of the actuation systems, such as coils or permanent magnets. This magnetic field may deform the individual stages.

The lithographic apparatus according to FIG. 5 has a first position measurement system including four sensor heads H1 that cooperate with a grating (not shown) on the reference structure (not shown). An example of such a cooperation can be seen in FIG. 6, where the sensor head H1 and the grating are shown in side view. The outputs of the sensor heads H1 are provided to a first processing unit or first processor PU1, which transforms the output signals of the sensor heads H1 into a first measurement signal X1 and a second measurement signal Y1 respectively corresponding to the position of the first stage ST1 relative to the measurement reference in X and Y direction.

The lithographic apparatus further includes a second position measurement system including two sensors S1 and S2 which are arranged to measure the position of the first stage ST1 relative to the element or magnet structure respectively in the X and Y direction.

Both the first and second measurement signal are provided to a first data processing device or first data processor DPD1, where the signals are corrected based on the outputs O1, O2 of the second position measurement device to provide a corrected first measurement signal C1_X and a corrected second measurement signal C1_Y respectively representing the position of the first object relative to the measurement reference in the X and Y direction. The correction is done to compensate for measurement errors resulting from the deformed stage caused by the magnetic field.

Similarly, the lithographic apparatus according to FIG. 5 has a third position measurement system including four sensor heads H2 that cooperate with a grating (not shown) on the reference structure (not shown). An example of such a cooperation can be seen in FIG. 6, where a sensor head H and the grating GP are shown in side view. The outputs of the sensor heads H2 are provided to a second processing unit PU2, which transforms the output signals of the sensor heads H2 into a third measurement signal X2 and a fourth measurement signal Y2 respectively representing the position of the second stage ST2 relative to the reference structure in X and Y direction.

The lithographic apparatus further includes a fourth position measurement system including two sensors S3 and S4 which are arranged to measure the position of the second object OB2 relative to the element or magnet structure respectively in the X and Y direction.

Both the third and fourth measurement signals are provided to a second data processing device or data processor DPD2, where the signals are calibrated based on the outputs O3, O4 of the fourth position measurement device to provide a calibrated third measurement signal C2_X and a calibrated fourth measurement signal C2_Y respectively representing the position of the second object relative to the measurement reference in the X and Y direction.

Figure 6:
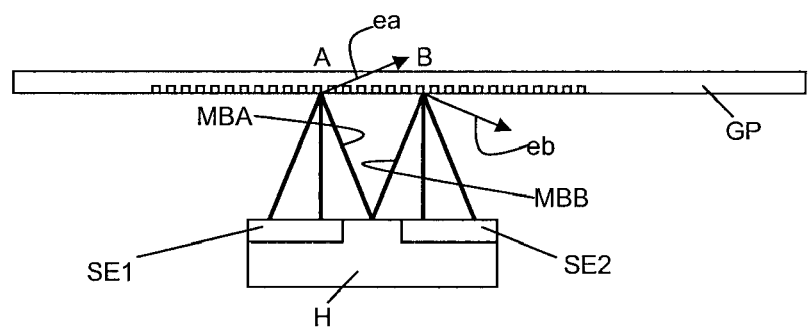
FIG. 6 depicts a position measurement system of a lithographic apparatus according to an embodiment of the invention.

FIG. 6 depicts an encoder/sensor including a sensor head SH and a grid plate GP, the encoder being configured to measure a position of the sensor head SH with respect to grid plate GP. In this example, an incremental encoder is applied, providing a periodic sensor head output signal when moving the sensor heads with respect to the grid plate. Position information may be obtained from periodicity and phase of corresponding sensor head output signals of the sensor head. In the embodiment shown, a sensor head assembly is depicted emitting two measurement beams MBA, MBB towards the grid plate. Due to an interaction with the pattern on the grid plate (which may be one dimensional or two dimensional), beams are returned towards the sensor head at an angle, as schematically depicted in FIG. 6, and detected by a suitable sensor element SE1,SE2 of the sensor head. Thus, the sensor heads provide for two measurements, namely at A and at B on the grid plate GP. Each of the measurements provides for a sensitivity in horizontal as well as in vertical direction. A sensitivity of the left one of the sensor elements SE1 is schematically indicated by vector ea, while a sensitivity of the right one of the sensor elements SE2 is schematically indicated by eb. In a present, practical implementation, an angle of ea and eb with respect to horizontal will be small, smaller than indicated in FIG. 6. In fact, the angles of ea and eb with respect to the horizontal plane are exaggerated somewhat for illustrative purposes. A measurement of the horizontal position can now be obtained from an addition of ea and eb. A measurement of the vertical position can be obtained from a subtraction of ea and eb, as outlined in the below expressions.

$$posX=k_1(ea+eb)/2$$

wherein posX represents horizontal encoder position information, and $k_1$ is a gain factor compensating for the fact that the vectors ea and eb are not exactly directed in the horizontal.

Figure 7:
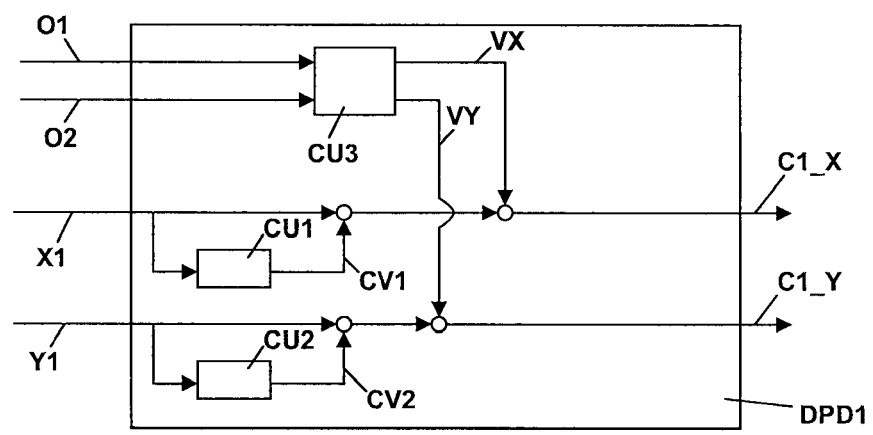
FIG. 7 depicts in block schematic view a data processing device of the lithographic apparatus of FIG. 5 in accordance with an embodiment of the invention.

FIG. 7 depicts in more detail the first data processing device DPD1 of the lithographic apparatus of FIG. 5. Input to the data processing device or data processor DPD1 are the first and second measurement signals X1 and Y1, and the outputs O1 and O2 of the second position measurement system. The first measurement signal X1 is corrected based on the first measurement signal X1 itself. A first correction unit or corrector CU1 converts the measurement signal X1 into a first correction value CV1 that is added to the first measurement signal X1. The first correction value CV1 is dependent on the position of the object relative to the reference structure in the X direction and represents the static errors of the sensor heads H1 in X direction, for instance the errors in the lines of the grating of the grid plate. Similarly, a second correction unit or corrector CU2 converts the second measurement signal Y1 into a second correction value CV2 that is added to the second measurement signal Y1. The second correction value CV2 represents the static errors of the sensor heads H1 in Y direction.

The outputs O1 and O2 of the second position measurement system are converted by a third correction unit or corrector CU3 into a value VX and a value VY that represent inconsistencies as a function of the position of the stage with respect to the element. Value VX is added to the first measurement signal, and VY is added to the second measurement signal, thereby resulting in a first calibrated measurement signal C1_X and a second calibrated measurement signal C1_Y respectively representing the position of the first object relative to the measurement reference in X and Y direction.

The second data processing unit or second data processor DPD2 of FIG. 5 has a similar configuration to output the third and fourth calibrated measurement signals.

As the four sensors H1 or H2 are able to measure the position of the stage in two coordinates each, the stage deformation can be determined by the corresponding measurement system itself, thereby allowing to obtain the values VX and VY, for instance by "fixing" the stage relative to the reference structure and moving the element or magnet structure RE.

Although the embodiments shown in the accompanied drawings relate to a substrate table supporting a substrate as object, the same may also apply to a support for holding a patterning device as object. The first positioning device PM and the support of the patterning device MT of FIG. 1 then form the stage holding the object.

It is further mentioned here that although the element or magnet structure is shown in the drawings as being part of actuation systems, the principle can be applied to any element or magnet structure providing a spatially varying magnetic field that deforms a stage and thereby influences the position measurements of the stage relative to a reference structure.

It is also possible that deriving the correction values includes modeling of the deformation process of the stage.

Further, the first position measurement systems are shown to measure a position of the stage relative to a reference structure. However, as mentioned before, an embodiment of the invention can also be applied to other measurement systems which are influenced by the deformation of the stage due to the spatially varying magnetic field. Examples of such measurement systems are measurement systems that align the substrate relative to the patterning device, level sensors, projection system sensors, etc.

It will be appreciated by the person skilled in the art that embodiments of the invention can be applied to all kind of degrees of freedom measured by the first position measurement system. Further, an embodiment of the invention can be applied to two measured degrees of freedom at the same time (as shown in the embodiment of FIGS. 5 and 7, but also to more than two measured degrees of freedom at the same time. For instance, the position of the stages can be measured in six degrees of freedom, and the measurement signals corresponding to each degree of freedom can all be corrected in accordance with an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a stage configured to hold an object, the stage being moveable relative to a reference structure in a motion range;
   a magnet structure configured to provide a spatially varying magnetic field in at least a part of the motion range, the magnet structure being moveable relative to the reference structure and the stage, and the stage being moveable over the magnet structure;
   a first position measurement system configured to provide a first measurement signal corresponding to a position of the stage, or the object, or both the stage and the object, in a measurement direction relative to the reference structure;
   a second position measurement system configured to provide a second measurement signal corresponding to a position of the stage relative to the magnet structure; and
   a data processor configured to correct the first measurement signal with a value which is dependent on the second measurement signal to provide a corrected first measurement signal representative of the position of the stage, or the object, or both the stage and the object, relative to the reference structure in the measurement direction.

2. The lithographic apparatus of claim 1, wherein the magnet structure comprises a permanent magnet configured to provide the spatially varying magnetic field.

3. The lithographic apparatus of claim 1, wherein the first position measurement system comprises a grating and a sensor head cooperating with the grating, wherein the grating is provided on one of the reference structure and the stage, and wherein the sensor head is provided on the other one of the reference structure and the stage.

4. The lithographic apparatus of claim 3, wherein the grating is provided on the reference structure and the sensor head is provided on the stage.

5. The lithographic apparatus of claim 1, wherein the second position measurement system comprises a sensor, an output of the sensor providing the second measurement signal.

6. The lithographic apparatus of claim 1, wherein the second position measurement system comprises two sensors and a processor, an output of one of the sensors being representative of a position of the stage relative to a measurement reference, and an output of the other one of the sensors being representative of a position of the magnet structure relative to the measurement reference, and wherein the processor is configured to combine the outputs of both sensors to provide the second measurement signal.

7. The lithographic apparatus of claim 1, wherein the reference structure is a base supporting the stage and the magnet structure.

8. The lithographic apparatus of claim 1, comprising:
   a support constructed to support a patterning device, the patterning device being capable of imparting a radiation beam with a pattern in its cross-section to form a patterned radiation beam;
   a substrate table constructed to hold a substrate; and
   a projection system configured to project the patterned radiation beam onto a target portion of the substrate,
   wherein the stage comprises the substrate table.

9. The lithographic apparatus of claim 1, comprising:
   a support constructed to support a patterning device, the patterning device being capable of imparting a radiation beam with a pattern in its cross-section to form a patterned radiation beam;
   a substrate table constructed to hold a substrate; and
   a projection system configured to project the patterned radiation beam onto a target portion of the substrate,
   wherein the stage comprises the support to hold the patterning device.

10. The lithographic apparatus of claim 1, wherein the stage is directly or indirectly supported by a base, the magnet structure being moveable relative to the base, and wherein an actuation system is provided between the stage and the magnet structure to move the stage.

11. The lithographic apparatus of claim 10, comprising a further stage, wherein a further actuation system is provided between the further stage and the magnet structure to move the further stage.

12. The lithographic apparatus of claim 11, comprising a third measurement system configured to measure a position of the further stage relative to the reference structure in the measurement direction and a fourth position measurement system, wherein the fourth position measurement system comprises a sensor configured to measure the position of the further stage relative to the magnet structure, and another data processor configured to correct a third measurement signal representative of the measured position by third measurement system with a value which is dependent on a fourth measurement signal representative of the measured position by the fourth measurement system to provide a corrected third measurement signal representative of the position of the stage, or the object, or both the stage and the object, relative to the reference structure in the measurement direction.

13. A method for correcting a position measurement of a stage, or an object held by the stage, or both the stage and the object, relative to a reference structure in a measurement direction, wherein the stage is moveable in a spatially varying magnetic field which in turn is moveable relative to the stage and the reference structure, the method comprising:
   providing, using a first measurement system, a first measurement signal corresponding to a position of the stage, or the object, or both the stage and the object, relative to the reference structure in the measurement direction;
   providing, using a second measurement system, a second measurement signal corresponding to a position of the stage relative to the magnetic field; and
   correcting, using a data processor, the first measurement signal with a value which is dependent on the second measurement signal to provide a corrected first measurement signal representative of the position of the stage, or the object or both the stage and the object, relative to the reference structure in the measurement direction.

14. The method according to claim 13, wherein the value is obtained by:
- a) keeping the stage stationary with respect to the reference structure;
- b) positioning the magnetic field at different positions relative to the stage;
- c) reading the first measurement signal in each different position of the magnetic field relative to the stage;
- d) determining any inconsistencies in the first measurement signal as a function of the position of the magnetic field relative to the stage; and
- e) deriving the value from any of the inconsistencies as a function of the position of the magnetic field relative to the stage.

15. The method of claim 14, wherein the inconsistencies in the first measurement signal as a function of the position of the magnetic field relative to the stage show a periodic behaviour, and wherein the positions in b) are chosen to cover one period of the inconsistencies, and the result in e) is extrapolated to the other positions using the periodicity.

16. The method of claim 13, wherein the value is obtained by:
- a) keeping the magnetic field stationary with respect to the reference structure in a first position;
- b) positioning the stage at different positions relative to the reference structure;
- c) reading the first measurement signal in each different position of the stage relative to the reference structure;
- d) repeating a)-c) when the magnetic field is kept stationary with respect to the reference structure in a second position different from the first position;
- e) deriving any inconsistencies dependent on the position of the magnetic field relative to the reference structure from the readings of the first measurement signal at the different positions of the magnetic field; and
- f) deriving the value from any of the inconsistencies as a function of the position of the magnetic field relative to the stage.

* * * * *